(12) United States Patent
Nalbant

(10) Patent No.: US 7,218,173 B2
(45) Date of Patent: May 15, 2007

(54) MINIMUM ON TIME, DUAL SUPPLY CLASS D AMPLIFIERS WITH GROUND SPEAKER RETURNS AND METHODS OF CLASS D AMPLIFICATION

(75) Inventor: Mehmet K. Nalbant, Cupertino, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 137 days.

(21) Appl. No.: 11/102,193

(22) Filed: Apr. 8, 2005

(65) Prior Publication Data
US 2006/0226904 A1    Oct. 12, 2006

(51) Int. Cl.
*H03F 3/217* (2006.01)
(52) U.S. Cl. .................................. 330/251; 330/207 A
(58) Field of Classification Search ............... 330/251, 330/207 A, 10
See application file for complete search history.

(56) References Cited

U.S. PATENT DOCUMENTS

| | | | | |
|---|---|---|---|---|
| 5,023,566 | A * | 6/1991 | El-Hamamsy et al. ...... | 330/251 |
| 6,420,930 | B1 * | 7/2002 | Takagishi ................... | 330/251 |
| 6,577,186 | B2 * | 6/2003 | Berkhout ..................... | 330/10 |

OTHER PUBLICATIONS

Maxim Integrated Products, Inc., "MAX9713/MAX9714: 6W, Filterless, Spread-Spectrum Mono/Stereo Class D Amplifiers", Mar. 2004, pp. 1-18.
Maxim Integrated Products, Inc., "MAX9703/MAXC9704: 15W, Filterless, Spread-Spectrum Mono/Stereo, Class D Amplifiers", Jan. 2005, pp. 1-19.

* cited by examiner

*Primary Examiner*—Henry Choe
(74) *Attorney, Agent, or Firm*—Blakely Sokoloff Taylor & Zafman LLP

(57) ABSTRACT

Class D amplifiers and methods of amplification wherein a load is periodically coupled to a positive power supply connection through a first switch or a negative power supply connection through a second switch for a period responsive to an input signal. A third switch couples the load to a circuit ground connection during times when the load is not coupled to either the positive or the negative power supply connection. This provides a load current recirculation path through the ground connection, which together with the inductance of the load, tends to maintain the load current when both the first and second switches are open. Loads such as speakers may be directly connected to the amplifier output, or may be coupled to the amplifier output through a filter. Various exemplary control methods, including use of feedback, are disclosed.

58 Claims, 15 Drawing Sheets

Vin @ 20kHz

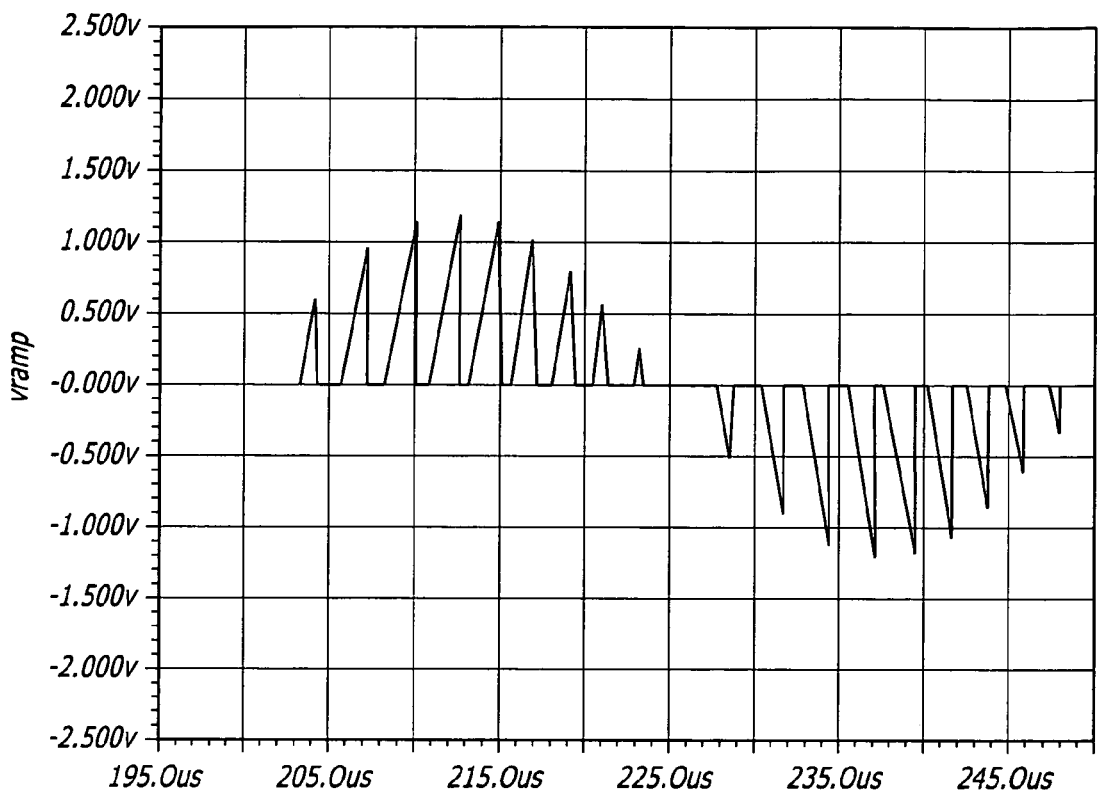
FIG. 4  Vin @ 20kHz
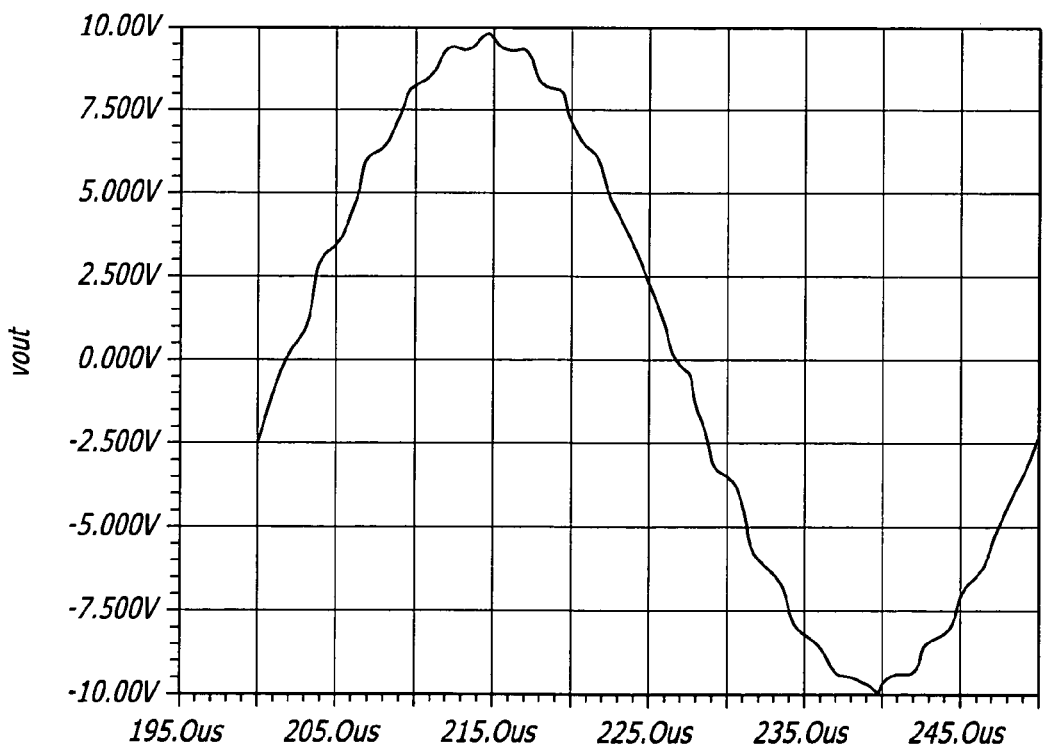
FIG. 5  Output voltage across the 8Ω load.

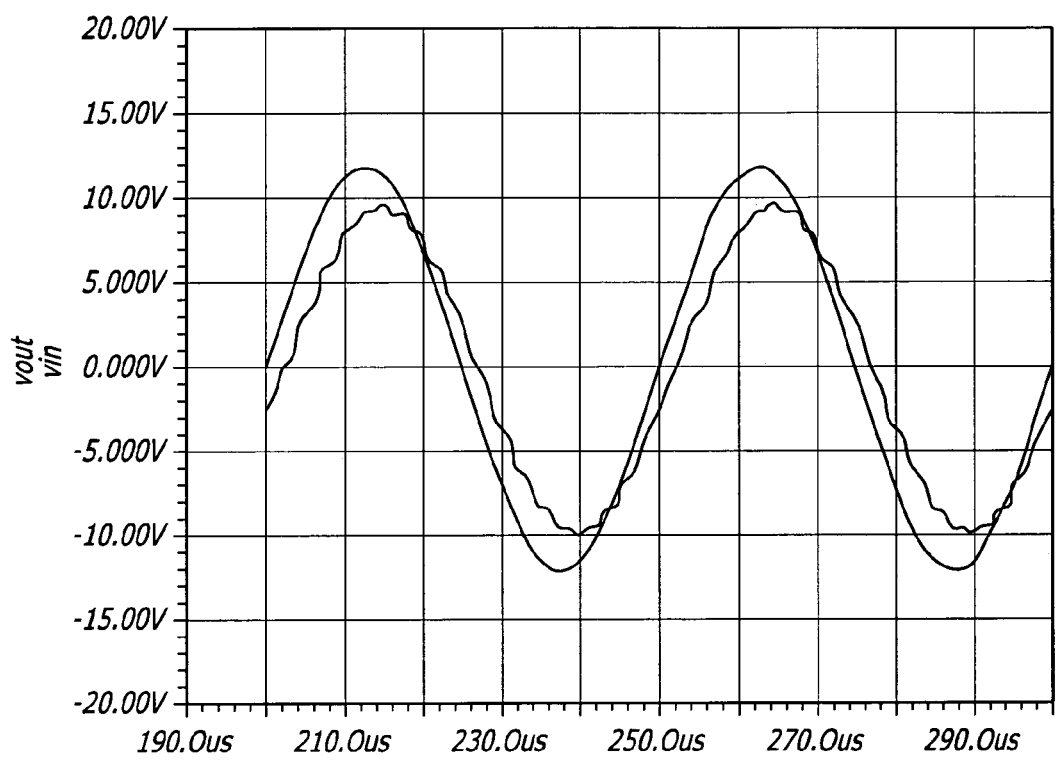
FIG. 6    Output voltage across the 8Ω load.
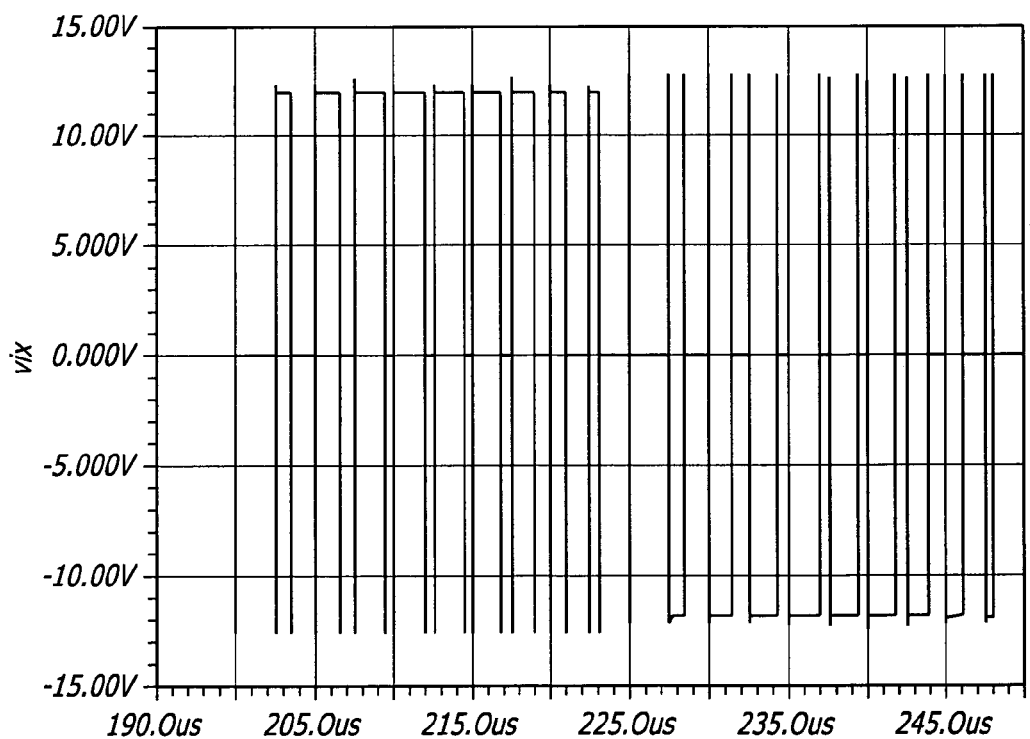
FIG. 7

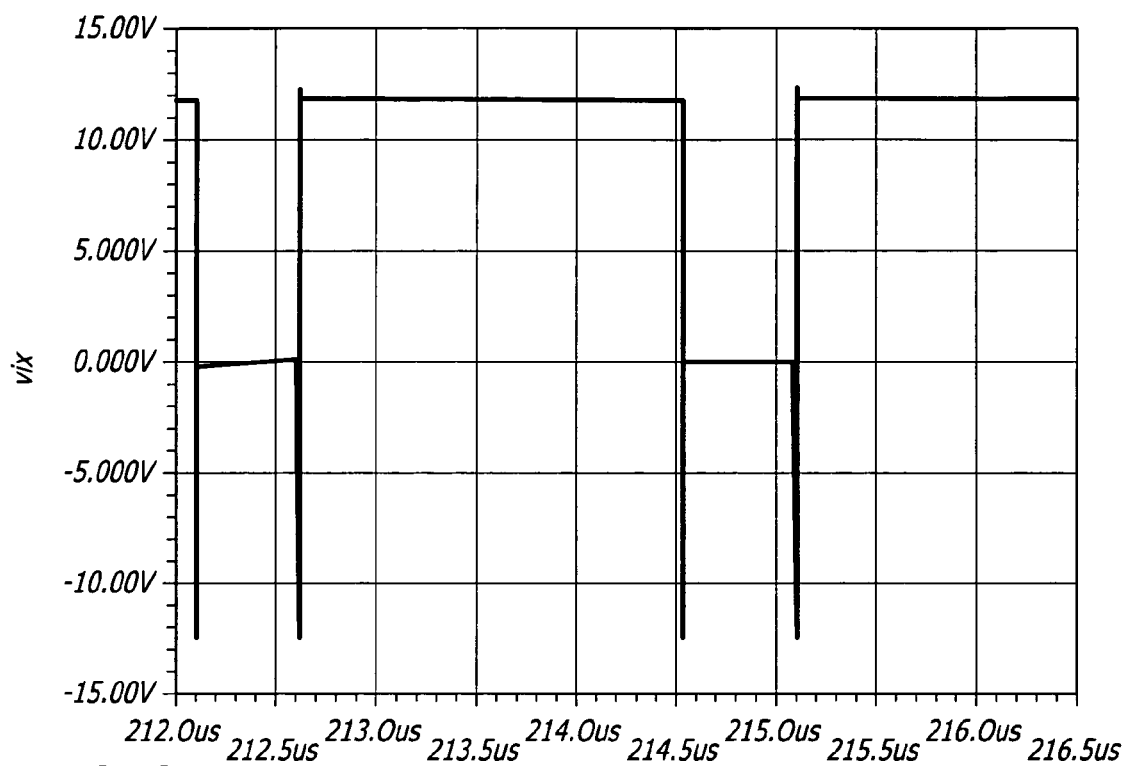
FIG. 8
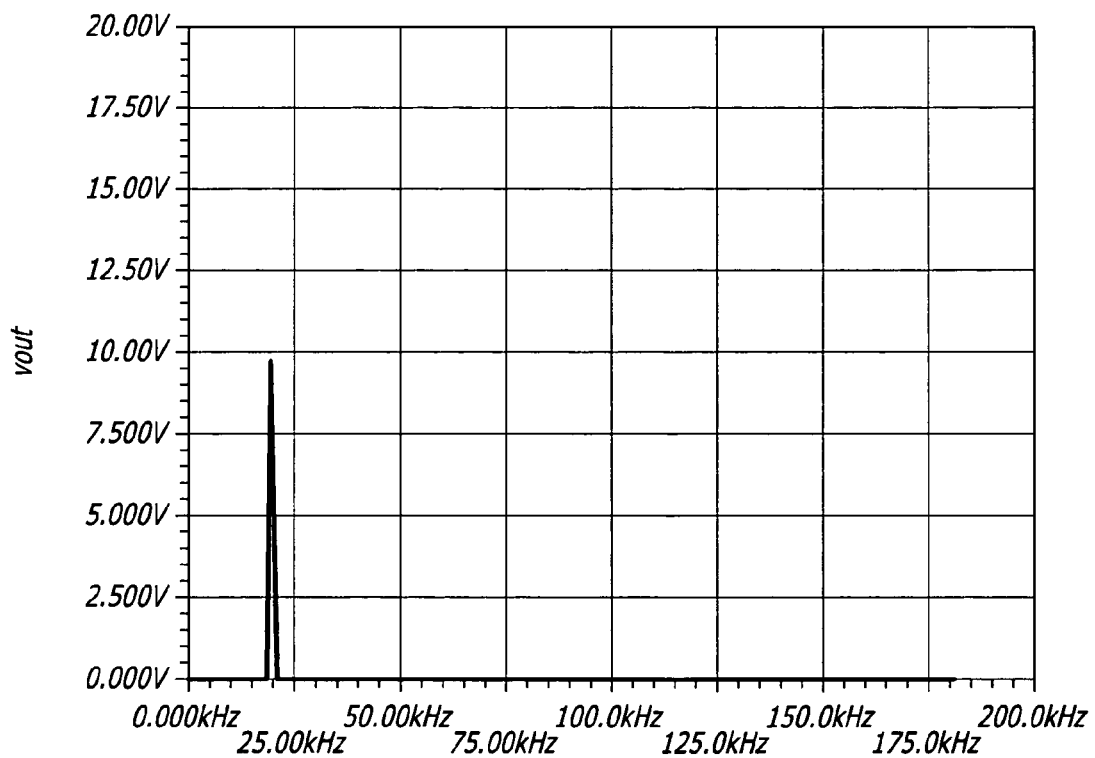
FIG. 9   Plot of fundamental. Amplitude=9.627V
        THD(20kHz)=0.496%   @ Pout=5.8W

MINIMUM ON TIME, DUAL SUPPLY CLASS D AMPLIFIERS WITH GROUND SPEAKER RETURNS AND METHODS OF CLASS D AMPLIFICATION

BACKGROUND OF THE INVENTION

1. Field of the Invention

The present invention relates to the field of amplifiers, and more particularly to class D amplifiers.

2. Prior Art

The introduction of high end Plasma and TFT-LCD TVs has spurred the need to use high efficiency power conversion processing elements in these TVs. A significant area where power processing takes place is the audio amplifier. The need for higher efficiencies is driven by the fact that the enclosures used are smaller and/or the TFT-LCD screens are sensitive to thermal gradients produced by heat generating components. Smaller, thinner enclosures also preclude the use of large and bulky heat sinks which are incompatible with automatic assembly. Thus audio amplifiers in these TVs are typically based on switching Class D amplifier architectures.

There are three main categories of devices currently being used as Class D amplifiers. These are:

1. Conventional modulation single supply full bridge (H-bridge). In this class of devices, the PWM signals have to be filtered before application to the speaker load. The duty cycle at each leg of the H-bridge at zero output voltage is roughly 50%. This results in non-used re-circulating currents in the filter elements, resulting in power loss even though no power is transmitted to the load.

2. Modified modulation single supply full bridge (H-bridge). This class of devices are H-bridge connected. However, unlike in the conventional method, their modulation technique allows the duty cycle to go to "zero" for no signal input. This avoids the re-circulating current at "zero" input signal. This type of Class D devices are also called "Filterless" as a result of the above described property.

3. Conventional Modulation dual supply half bridge. There are several devices that use this method. The modulation method is similar to that of the conventional H-bridge. The output filter re-circulates current with zero input signal.

Presented later herein is a table illustrating various characteristics of the above modulation techniques for comparison with the same characteristics of the present invention.

BRIEF DESCRIPTION OF THE DRAWINGS

FIG. 4 is a graph illustrating the modulating ramp for the pulse width modulators of the circuit of FIG. 2.

FIG. 5 is a graph showing the output voltage across the 8 Ω load of the circuit of FIG. 2.

FIG. 6 is a graph presenting both the 20 kHz signal input and the output voltage across the load.

FIG. 7 shows the voltage waveform at the switching node VLX (an output node) during both positive and negative half cycles.

FIG. 8 presents part of FIG. 7, taken on an expanded scale, to illustrate the negative going spikes that may be present in the switching waveform during the positive half cycle.

FIG. 9 is a plot of output harmonics versus frequency for the circuit of FIG. 2 when operating near its maximum output.

DETAILED DESCRIPTION OF THE PREFERRED EMBODIMENTS

Figure 1:
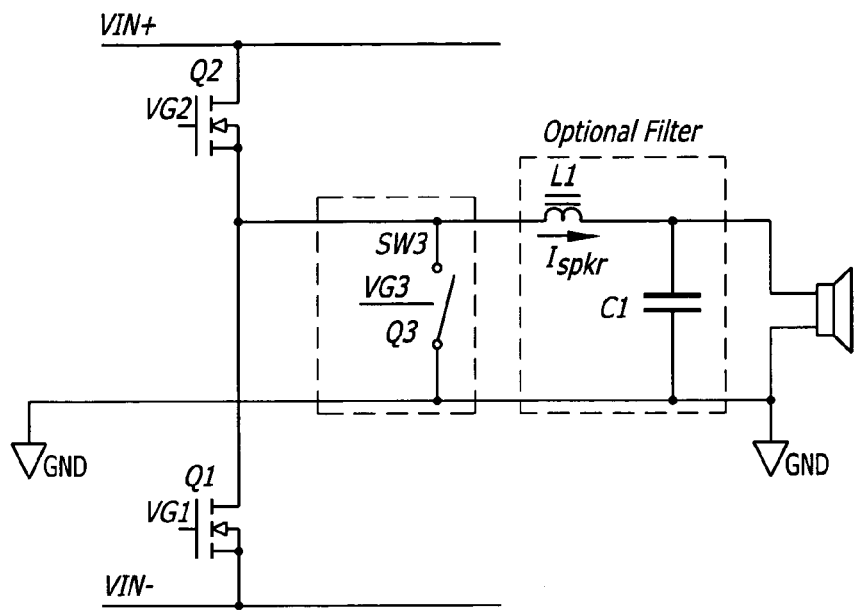
FIG. 1 is a diagram illustrating the basic structure of the power circuit of the present invention.

FIG. 1 is a simplified circuit diagram showing the basic structure of an embodiment of the present invention. As shown therein, three switches are provided, namely, transistors Q1, Q2 and switch SW3. Transistors Q1 and Q2 are coupled in series between the positive and negative power supply voltages VIN+ and VIN−, with the speaker SP being coupled between the node between transistors Q1 and Q2 and ground GND. Also shown in the Figure is an optional filter comprised of inductor L1 and capacitor C1, the optional filter helping to clarify the description of this basic structure, though in filterless applications the inductance of the speaker (or other load) may provide the desired inductance, as shall be made more clear by the description to follow. Switch SW3 is coupled between the node between transistors Q1 and Q2 and ground. In operation, one of transistor switches Q1, Q2 and SW3 is on at all times, though any two or all three switches are never on at the same time.

The transistor switches are controlled by a control circuit (not shown in this Figure) that is responsive to an input signal. When the input signal is positive, switch Q2 is closed for a period of time dependent upon the amplitude of the positive input signal, after which switch Q2 is opened and switch SW3 is closed, providing a current recirculation path from the speaker SP through the circuit ground to the inductor L1. Because SW3 may be subject to voltages of either polarity when off, and of current flow in either direction when on, switch SW3 needs to be a bilateral switch, as further described later. On the next clock cycle, the process will repeat, though when the input signal goes negative, switch Q1 will be turned on instead of switch Q2, again for a time period dependent upon the magnitude of the negative input signal, followed again by the turning off of switch Q1 and turning on of switch SW3 to short the load.

Figure 2A:
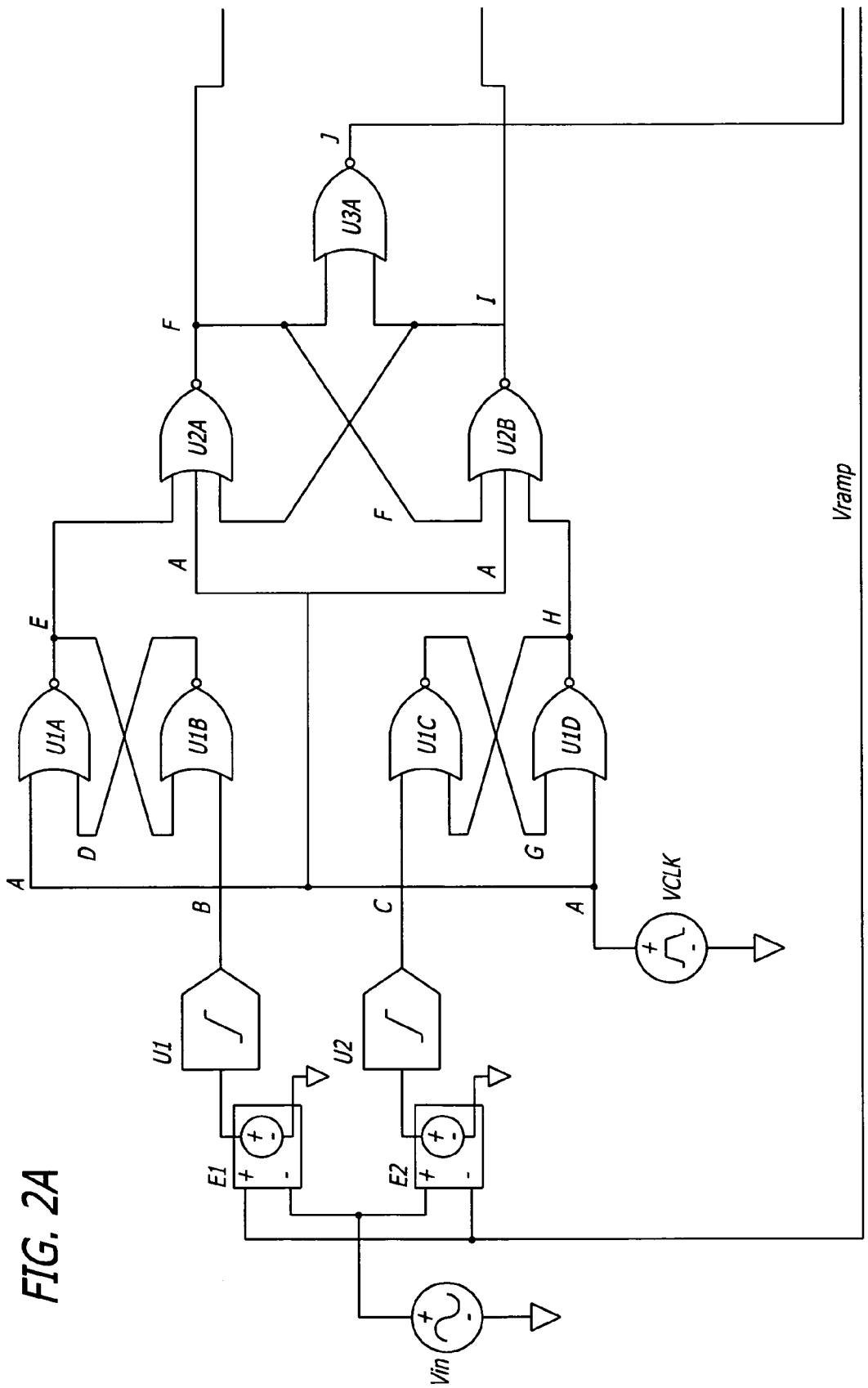
FIG. 2 presents a simulation macromodel of an open loop embodiment (no negative feedback applied) of the Class D amplifier of the present invention.
Figure 2B:
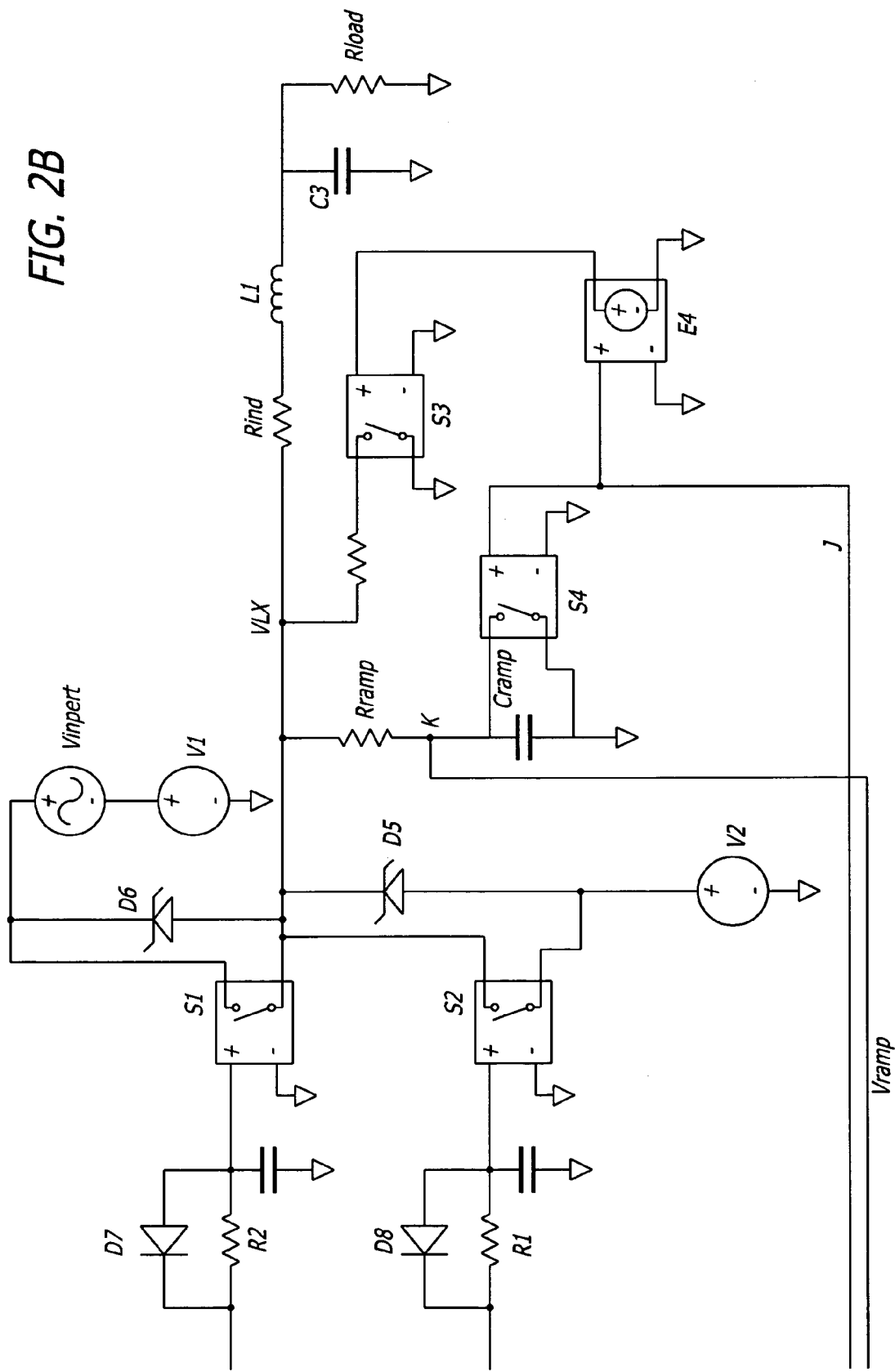

A verification circuit for the present invention may be seen in FIG. 2. In this circuit, switch S1 and switch S2 correspond to switches Q2 and Q1 in FIG. 1. Switch S3 corresponds to switch SW3 of FIG. 1. When switch S1 is closed, node VLX is connected to the positive power supply V1, such as a 12 volt supply, whereas when switch S2 is closed, node VLX is connected to the negative power supply V2, in this example −12 volts. When both switch S1 and switch S2 are open, switch S3 is closed, providing a path to ground to allow current to continue to flow in the load Rload through the circuit ground and back to inductor L1 (C3 providing some filtering for the voltage across the load and Rind representing the resistance of the inductor L1).

In operation, an input signal Vin is provided to the negative and positive inputs of devices E1 and E2, respectively, the other inputs to devices E1 and E2 being a feedback signal Vramp taken from node K between Rramp and Cramp. If the input to either device E1 or E2 is positive (+ being more positive than −, or − being more negative than +), then an output is provided to the respective limiter U1 or U2 to drive node B or node C high. These devices therefore essentially provide the function of comparators, with their outputs being limited by limiters U1 and U2.

The circuit is pulsed by the clock signal CLK at node A generated by a clock VCLK. At this time, both nodes F and I will be low, independent of the amplitude and polarity of the input signal VIN. This also holds node J high (it would have already have been high), assuring the continued discharge of capacitor Cramp. Accordingly, switches S1 and S2 will both be open, though the high state on node J will also cause comparator E4 to close the recirculation switch S3 to provide the recirculation current flow path through ground for the load.

When the clock pulse on node A goes low, the voltage on node Vramp will be at ground. Accordingly, either the voltage on node C or on node B will be high, depending on whether the input signal VIN is plus or minus, respectively. Assume first that the voltage VIN is plus, driving node C high. The clock signal on node A going low together with the high signal on node C will drive node F high, node I staying low. Thus node J will go low, turning off switches S3 and S4. Node F, being high, turns on switch S1, connecting load VLX to the positive supply V1. Current will now build in the positive direction through inductor L1 and its load, and the capacitor Cramp will start charging through the resistor Rramp.

When the voltage across Cramp reaches the input voltage VIN, the voltage on node C will go low, driving the voltage on node F low to turn off switch S1. At the same time, with both Node F and node I low, node J will go high, turning on switches S3 and S4 to provide a load current recirculation path through the circuit ground and to discharge Cramp. On the next clock pulse CLK, the process will repeat, so that on each clock cycle during a positive input signal VIN, node VLX will repeatedly be connected to the positive power supply for a time period dependant on the voltage VIN (and inversely proportional to the power supply voltage, less voltage drops in switches S1 and S2).

When the voltage VIN goes negative, node B will go high. During the next clock pulse, nodes G and K will stay low and node J will stay high. However, at the end of the clock pulse, node I will go high and node J will go low, turning off the switch S4 and the recirculation switch S3 and turning on switch S2. This connects node VLX to the negative power supply V2, now charging Cramp negatively through Rramp until the voltage across Cramp equals the negative input VIN, at which time node C again goes low. This drives node I low, and with nodes F and I both low, node J will go high, turning off switch S2 and turning on switches S4 to discharge the capacitor Cramp and switch S3 to provide the load current return path through ground.

TABLE 1

| VIN | VIN −M | A CLK | B | C | D | E | F | G | H | I | J | K | S1 | S2 | S3 | S4 |
|---|---|---|---|---|---|---|---|---|---|---|---|---|---|---|---|---|
| 1 | + | + | hi | lo | hi | lo | lo | lo | lo | lo | lo | hi | 0 | O | O | C | C |
| 2 | + | + | lo | lo | hi | hi | lo | hi | lo | hi | lo | lo | ↑ | C | O | O | O |
| 3 | + | − | lo | hi | lo | lo | hi | lo | lo | hi | lo | hi | 0 | O | O | C | C |
| 4 | − | − | hi | hi | lo | lo | lo | lo | hi | lo | lo | hi | 0 | O | O | C | C |
| 5 | − | − | lo | hi | lo | lo | hi | lo | hi | lo | hi | lo | ↓ | O | C | O | O |
| 6 | − | + | lo | lo | hi | lo | hi | lo | lo | hi | lo | hi | 0 | O | O | C | C |

Table 1 above presents all of the logic states of the various NOR gates and certain other nodes of the circuit of FIG. 2. It also sets forth the state of the switches at various times, "O" for open and "C" for closed. It will be seen therein that switches S3 and S4 operate in unison, though at no time is more than one of switches S1, S2 and S3 closed. In that regard, preferably care is taken in the switching to assure that no two of these switches is on at the same time, (the connection of NOR gates U2A, U2B and U3A assures that) though to the extent reasonably possible, to also ensure that at least one of these three switches is on at all times. In that regard, diodes D7 and D8 and resistors R1 and R2 aid in the timing of the switching, and zener diodes D5 and D6 providing back EMF current flow paths if all the three switches are momentarily off.

It can be seen from Table 1 that for a positive input signal VIN, after the clock signal CLK on node A, the voltage on node K begins rising above ground until the feedback signal Vramp exceeds the positive input, at which time switch S1 is opened again and switch S3 is closed to discharge the capacitor Cramp. Similarly, for a negative input voltage VIN, the voltage at node K decreases from ground until going below the negative input voltage, at which time switch S2 is opened and switches S4 and S3 are closed to discharge Cramp and provide load recirculation current through the circuit ground.

Figure 3:
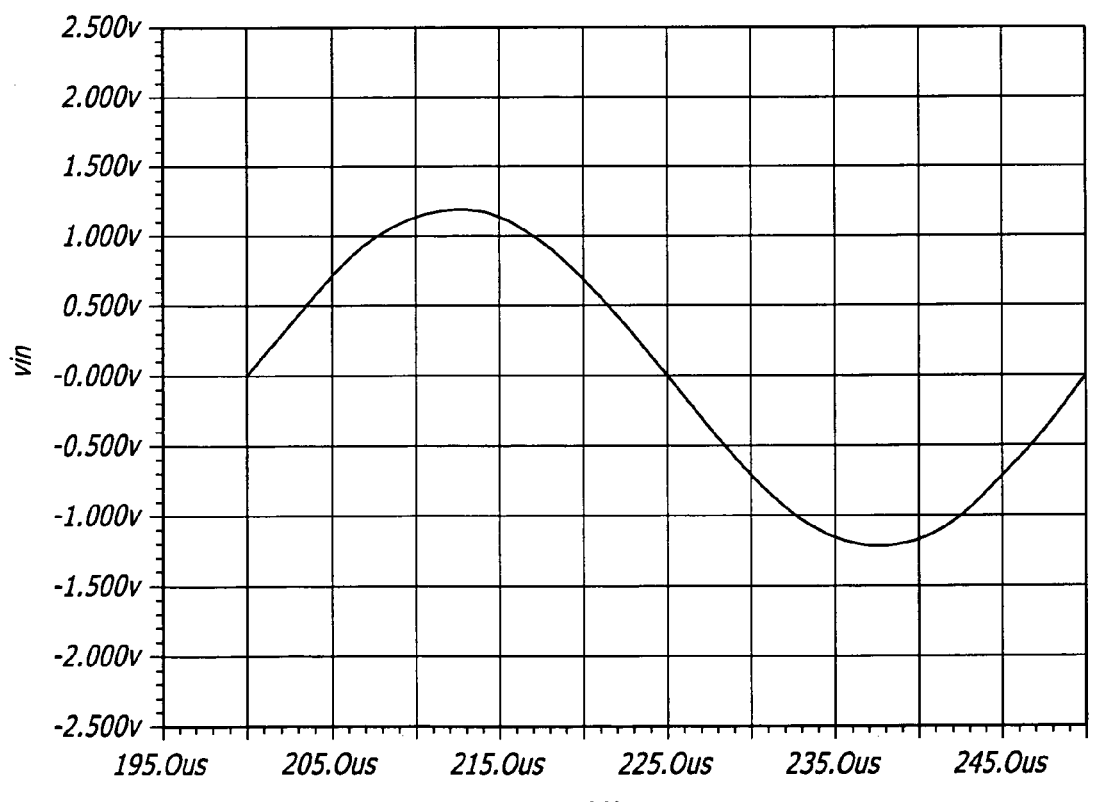
FIG. 3 illustrates an input voltage Vin waveform at 20 kHz.

Now referring to FIGS. 3 and 4, an input voltage waveform and the voltage waveform at node K (namely, the voltage Vramp waveform) may be seen. In this example, the input shown in FIG. 3 was a 20 kHz sine wave, with the waveform for the feedback Vramp shown in FIG. 4 being the waveform using a clock frequency CLK of approximately 20 times the input signal VIN, or in this example, 400 kHz. The slope of the ramps in the waveform of FIG. 4 is inversely proportional to the voltage present on the switching node VLX. This voltage would be dependent upon the power supply voltage and will include errors as a result of drops in the switches S1 and S2. If for example, the power supply voltage decreased, the rate of charging of Cramp in both the positive and negative directions will decrease by a similar percentage, thereby increasing the time required to charge Cramp to the input voltage, compensating for the loss in power supply voltage. Accordingly, errors such as power supply noise and resistance variations in switches S1 and S2 get corrected automatically. This is true whether the variations are symmetrical or unsymmetrical, as the automatic corrections are on a half wave basis, so to speak.

Now referring to FIGS. 5 and 6, the output voltage across an 8 Ω load for the circuit of FIG. 2 with the input of FIG. 3 may be seen. It will be noted that while the input signal has an amplitude of approximately 1.2 volts, the output waveform has an amplitude of approximately 10 volts. For a given output load circuit, the gain is dependent primarily on the RC time constant of Rramp and Cramp. In applications where a variable gain is needed, the resistance Rramp could be varied manually or under program control by switching resistors into and out of the circuit, as desired. Also while the gain may be varied as desired, the input signal VIN preferably will be limited in amplitude to a reasonably small percentage of the power supply voltage, as the charging of Cramp with either switch S1 or switch S2 on is substantially linear only over a limited fraction of the power supply voltage. Thus, depending on the application, preferably the input voltage amplitude is limited to approximately 25% or less of the power supply voltage, and more preferably, to approximately 10% or less of the power supply voltage.

The waveform in FIG. 5 is for the circuit of FIG. 2 with the LC filter of inductor L1 and capacitor C3. The presence of the filter causes a phase shift between the input signal and the output signal, as may be seen in FIG. 6. In that Figure, the input signal has been scaled upward by a factor of ten for better clarity in the comparison. In filterless applications where the speaker or other load is driven directly without that filter, the phase shift would not be present, though an output waveform having larger high frequency components could be expected.

Now referring to FIG. 7, the waveform at node VLX may be seen. This Figure shows the node voltage for both positive and negative input voltage VIN half cycles. The horizontal line segments substantially at zero volts represent the time periods during which both switches S1 and S2 are open and switches S3 and S4 are closed. Approximately the first half of the Figure is for the positive half cycle input voltage and the second half is for the negative half cycle input voltage. FIG. 8 shows a portion of the positive going half cycle on an expanded time scale.

It will be noted that each positive going pulse representing the time that switch S1 is closed is both preceded and succeeded by a negative going pulse of slightly greater amplitude. Similarly, each negative going pulse corresponding to the time switch S2 is closed is preceded and succeeded by a positive going pulse, again of slightly greater amplitude. These preceding and succeeding pulses arise because of the open before close characteristic of switches S1, S2 and S3 of FIG. 2. In particular, in the circuit of FIG. 2, for a positive going pulse, switch S3 will open momentarily before switch S1 closes. When switch S3 opens, the back EMF of inductor L1 will drive the voltage on node VLX sufficiently negative to forward bias zener diode D5. Then when switch S1 closes, the voltage on node VLX will substantially immediately rise to the positive power supply voltage. Similarly, at the end of the positive going pulse, switch S1 will open momentarily before switch S3 closes, with the back EMF of inductor L1 again creating a negative pulse of sufficient amplitude to forward bias diode D5. Of course the opposite sequence happens when the input signal is negative, switch S3 opening momentarily before switch S2 closes for a negative going pulse on VLX, and switch S2 opening momentarily before switch S3 closes at the end of that pulse. These back EMF voltage pulses can readily be eliminated or minimized by one skilled in the art by providing closer switch timing than illustrated in these Figures.

FIG. 9 shows a spectrum analysis of the output of the amplifier circuit of FIG. 2 for the 20 kHz input. On the scale shown, the harmonics in the 20 kHz output do not show, the total harmonic distortion at 20 kHz with a power output of 5.8 watts being only 0.496%. The amplitude of the fundamental frequency output for the plot is 9.627 volts.

Figure 10:
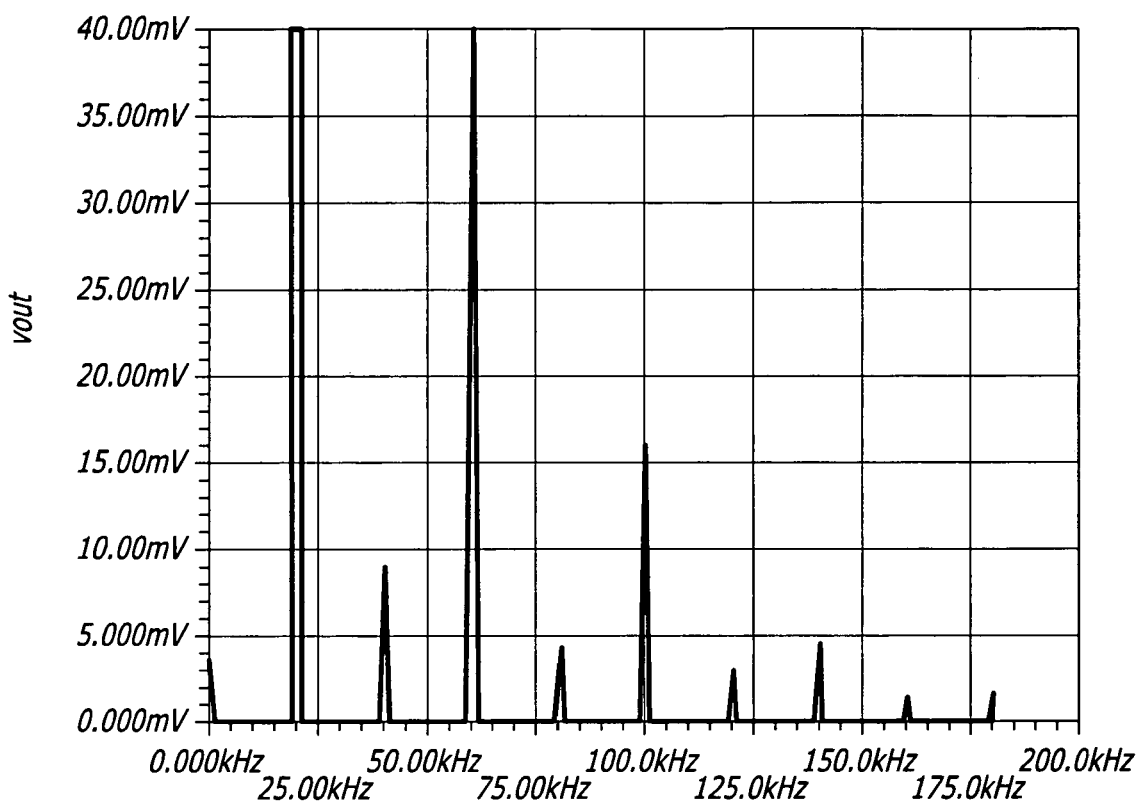
FIG. 10 is a plot of output harmonics versus frequency similar to that of FIG. 9, but taken on an expanded vertical scale to illustrate the relative amplitudes of the harmonics in the amplifier output.

FIG. 10 presents the same plot as FIG. 9, though on an expanded vertical scale, truncating the fundamental frequency output, though illustrating the relative amplitudes of some of the lower harmonics. The second harmonic (40 kHz) is 8.8 millivolts, the third harmonic (60 kHz) is 44 millivolts, the fourth harmonic (80 kHz) is 4.2 millivolts and the fifth harmonic (100 Hz) is 15.75 kHz. Thus, all of the harmonics are relatively low, with the even harmonics being suppressed more than the odd harmonics. Of course these results represent the results obtained with a specific circuit operating under specific conditions. Still, the total harmonic distortion is quite low under these exemplary conditions, even when the output of the amplifier is driven reasonably close to the rail voltages.

Referring again to FIG. 2, it will be noted that in the positive power supply line, a sine wave generator Vinpert is shown. This is for test purposes, specifically to inject unsymmetrical power supply noise to verify unsymmetrical power supply noise rejection. For the same reason as the amplifier has good rejection of symmetrical power supply noise, the rejection of unsymmetrical power supply noise is also good.

It will be noted that switch S4 must turn on to discharge the capacitor Cramp, which will, at different times, have both a positive charge and a negative charge. Thus a bilateral switch is needed. In that regard, bilateral switch is a switch which can block current flow in either direction in spite of a voltage across the switch encouraging such current flow, or allow current flow through the switch in either direction, depending on the state of the switch.

Figure 11:
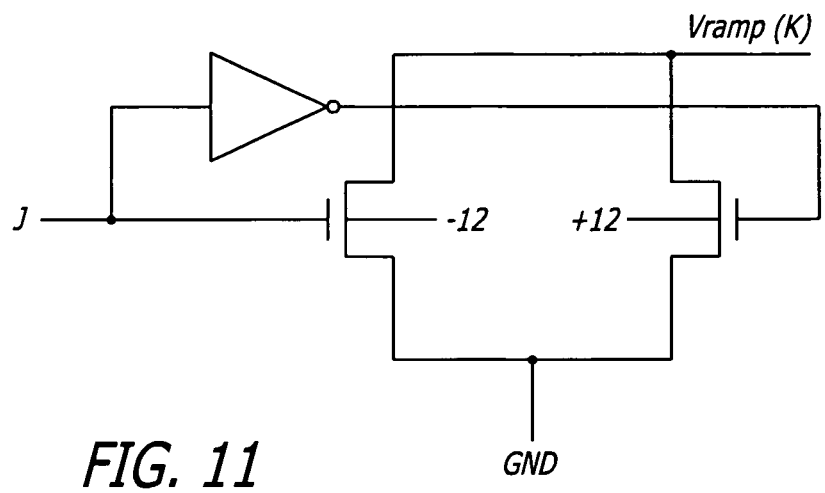
FIG. 11 is a circuit diagram of a bilateral switch.

A bilateral switch in integrated circuit form may be provided by a PMOS device and an NMOS device connected in parallel, each in a separate pockets with the body of the PMOS device connected to the positive power supply terminal and the body of the NMOS device connected to the negative power supply terminal. Such a circuit is shown in FIG. 11. Note that since one of the bodies would be forward biased with respect to the substrate, dependent on its conductivity type, one of the transistors would need to be in a pocket within another pocket. A similar circuit may be used for switch S3. In that regard, switches S1, S2 and S3 may be part of an integrated circuit embodiment of the invention, or may be discrete devices.

Figure 12A:
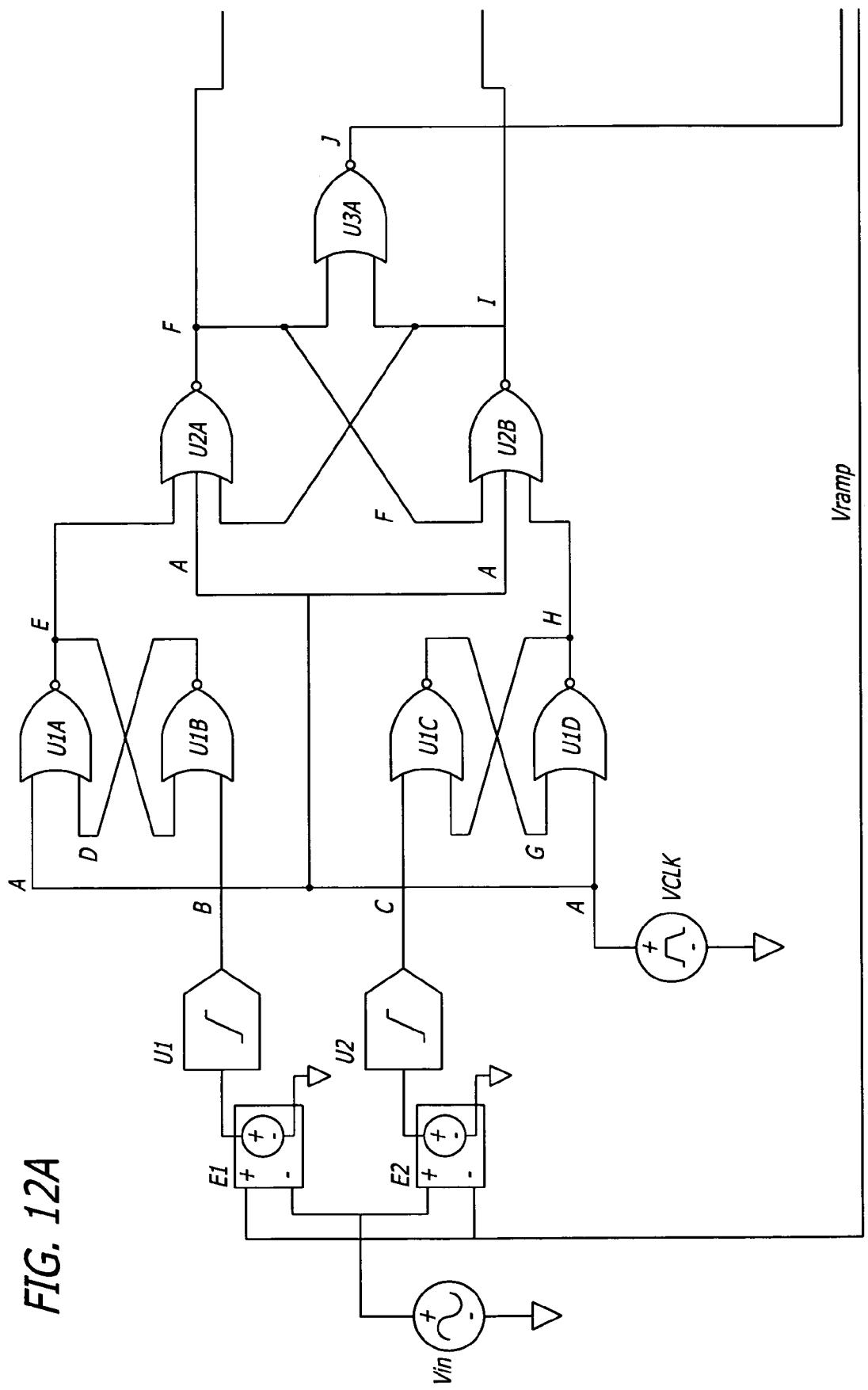
FIG. 12 is a diagram for a simulation macromodel of an open loop, filterless embodiment of the Class D amplifier of the present invention using an active current source for generation of the modulating ramp.
Figure 12B:
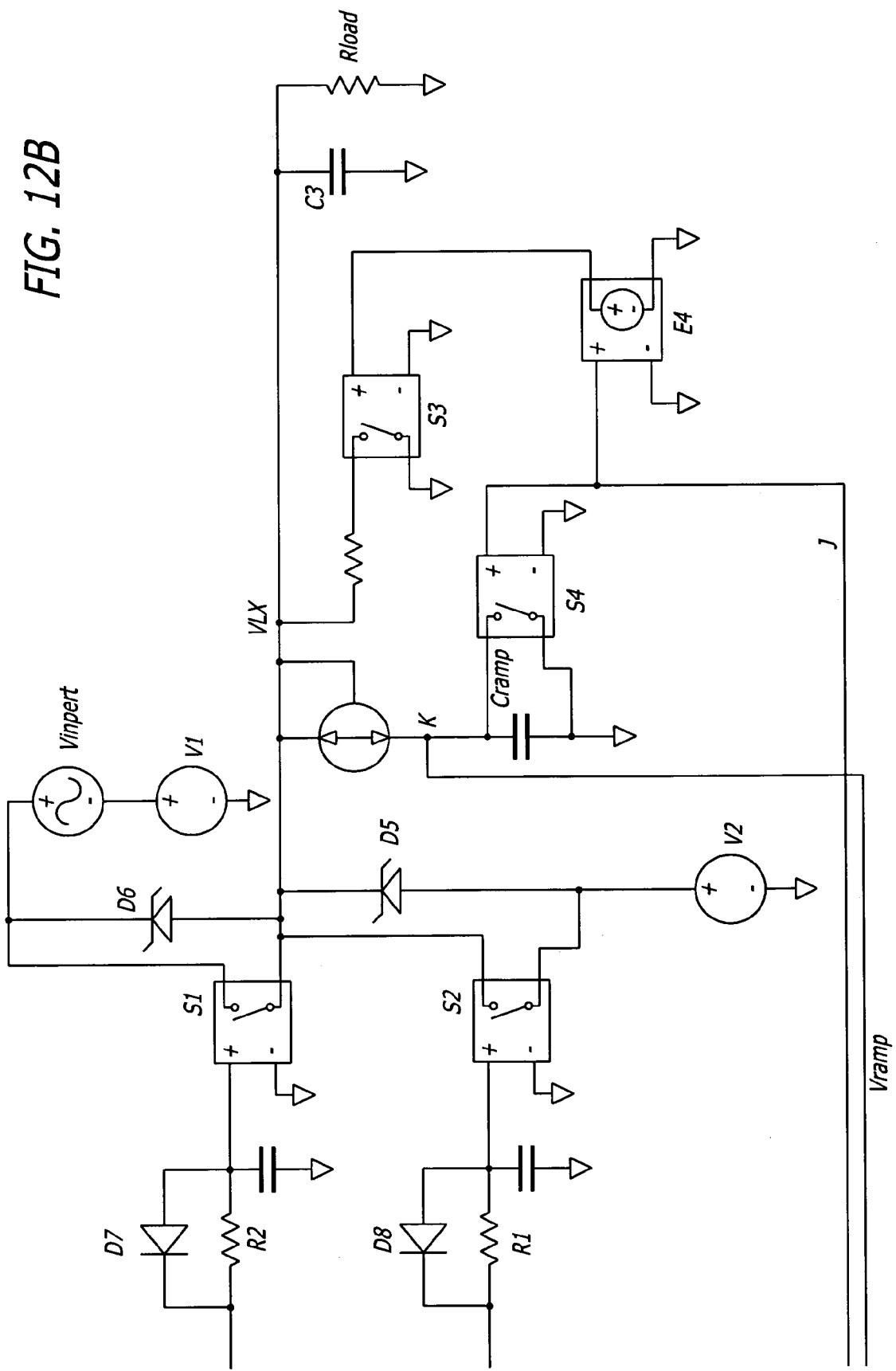

Also as indicated in FIG. 1, in some applications, the filter shown as optional in that Figure and included in the circuit of FIG. 2 may not be required for satisfactory performance. By way of example, a speaker impedance typically is highly resistive, though also has a meaningful inductance. Consequently, while inclusion of some filtering at the load should normally reduce noise and distortion, the performance attained without a filter may be adequate. FIG. 12 illustrates such an embodiment.

Also in FIG. 12, the resistor Rramp of FIG. 2 has been replaced by an active current source. Such a current source would need to be bilaterally operative, as controlled by the polarity of the voltage on the node VLX, though could be realized by two separate current sources, one active on a positive input and the other active on a negative input, preferably referenced to the same reference current to maintain balance of the circuit. Also, it is preferable to have any active current sources provide currents that are proportional to the respective power supply voltages, as this tends to minimize the effect of power supply noise on the amplifier output.

Figure 13:
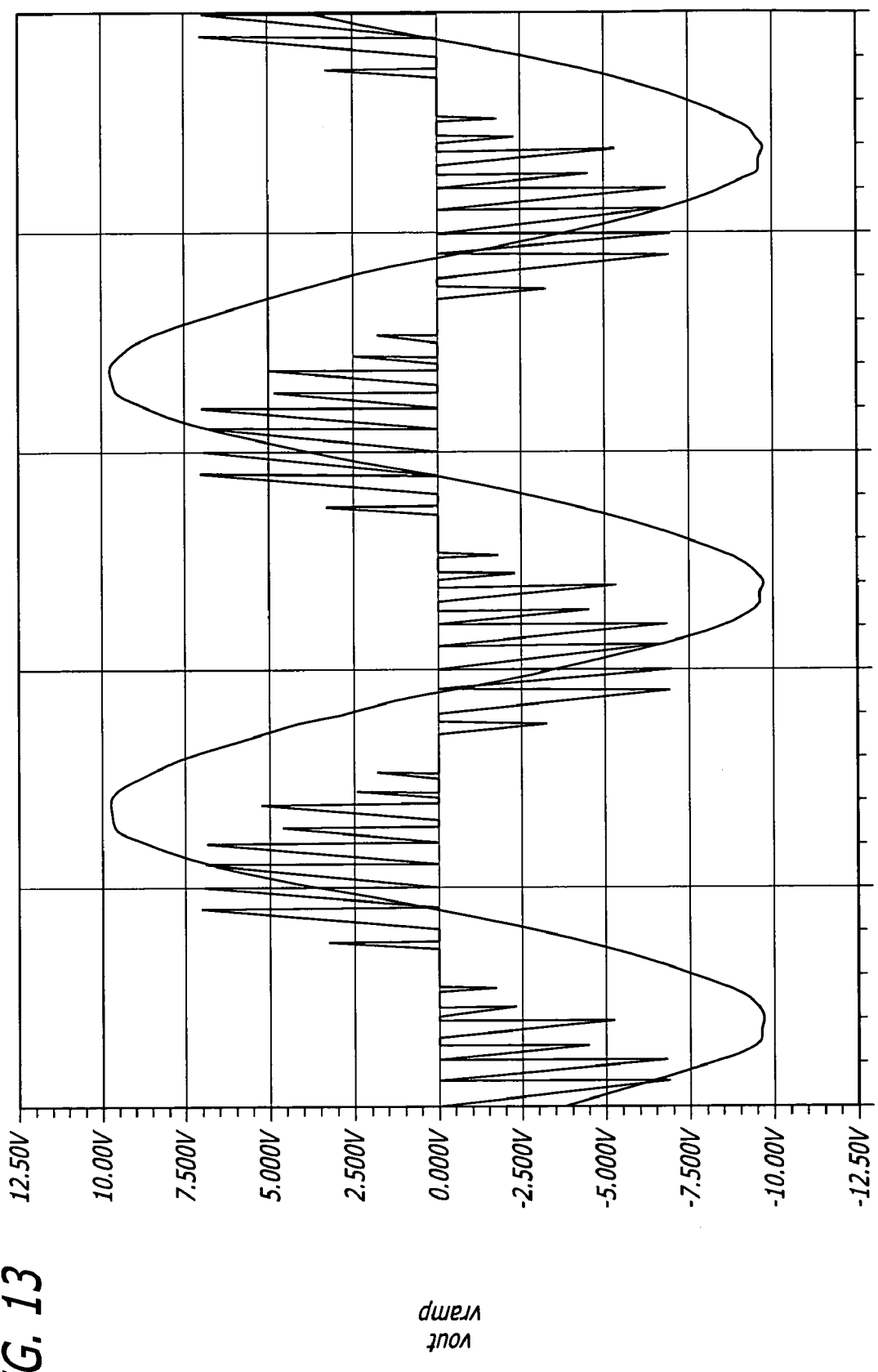
FIG. 13 is a graph showing the actual circuit performance for the circuit of FIG. 2.

FIG. 13 presents actual circuit performance for the verification circuit of FIG. 2, showing a sine wave input and the actual ramp waveform at the load for a near full scale output. However for small signal inputs, the circuit of FIG. 2 may not provide the desired performance. In particular, a small input signal ideally would produce a short (in both magnitude and time) ramp in the voltage at node VLX. However actual ripple-through time delays can extend the ideal ramp duration, delivering more power to the load than corresponds to the actual input signal. Since capacitor Cramp is discharged on each clock cycle, excess power will be delivered to the load on each clock cycle until the input signal reverses polarity, so the effect is not self correcting. When the input signal reverses sign, the same occurs, again delivering excess power of the opposite polarity to the load.

Figure 14A:
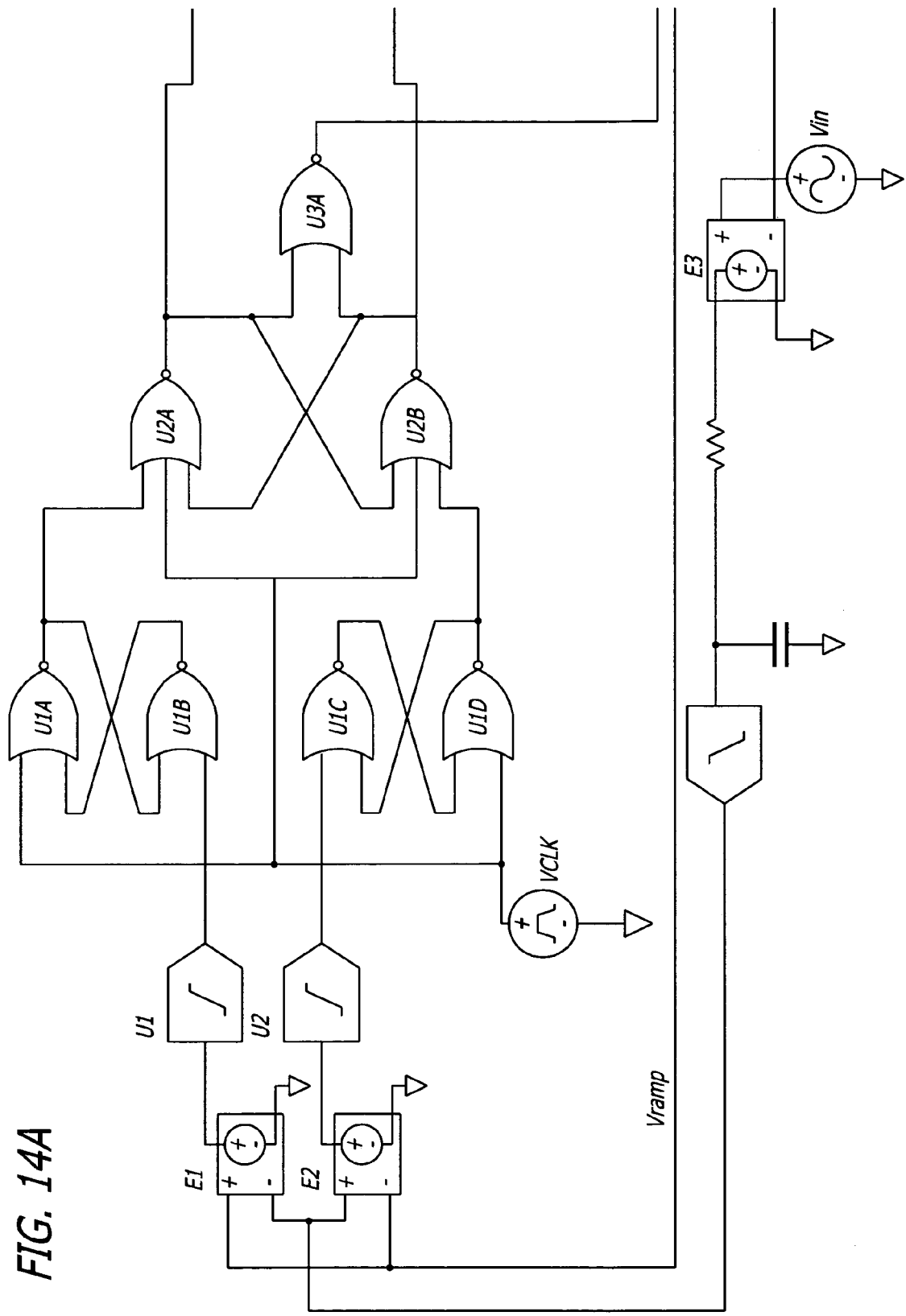
FIG. 14 is a diagram of a simulation macromodel of a closed loop embodiment of the Class D amplifier of the present invention.
Figure 14B:
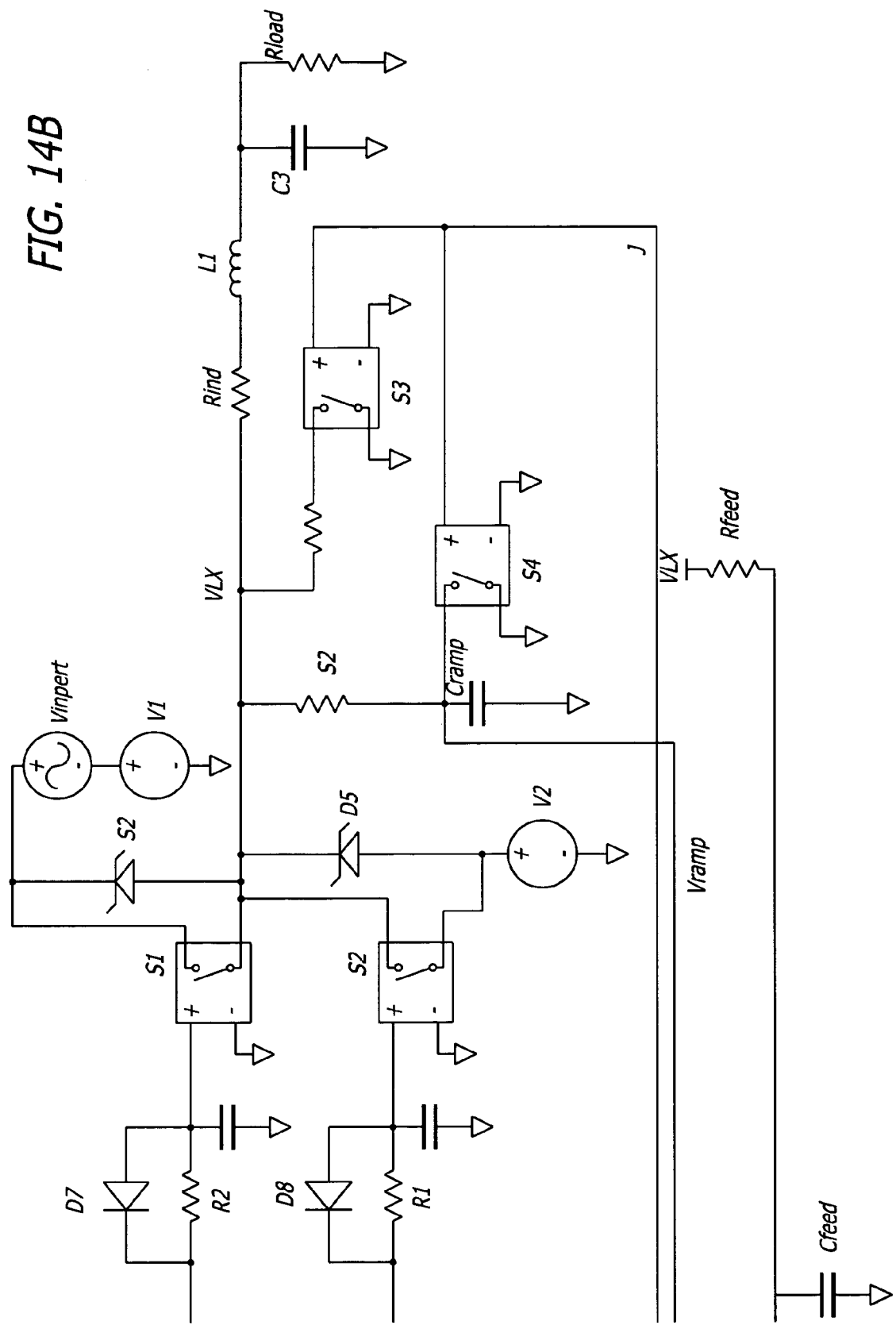

One way of reducing the foregoing effect is to provide feedback from the node VLX to the input. An exemplary circuit for doing this is shown in FIG. 14. The voltage on node VLX is fed back through an integrating network of resistor Rfeed and capacitor Cfeed to a switch S5. The other input to the switch S5 is the input signal Vin itself. Now first consider an input signal of "zero" amplitude. On one clock cycle, the input signal will be interpreted as plus or minus (NOR gates U2A and U2B are coupled to exclude the possibility of nodes F sand I both being high). If plus, node VLX will be connected to the positive power supply and power will be momentarily delivered to node VLX. This will be sensed by the integrator of resistor Rfeed and capacitor Cfeed, increasing the negative input on switch S5 above the zero input, driving the output of comparator E3 low. Also the voltage on the capacitor Cramp will be positive, on the next clock pulse, node B will go high, which will momentarily turn on switch S2. Consequently, on each clock cycle, too much power will be delivered to node VLX, but with alternating polarity having a zero average value. For very small input signals, it can be shown that the circuit will perform similarly, with the power delivered to node VLX having an average value commensurate with the input signal and the amplifier gain. When operating with a zero input signal, the pulses Vramp and the output VOUT across the load may be seen in FIG. 15. It may be seen that the average value of the output is zero, and that the reversal of the ramp on each clock pulse means that the fundamental frequency in the output ripple is one half the clock frequency.

Figure 15:
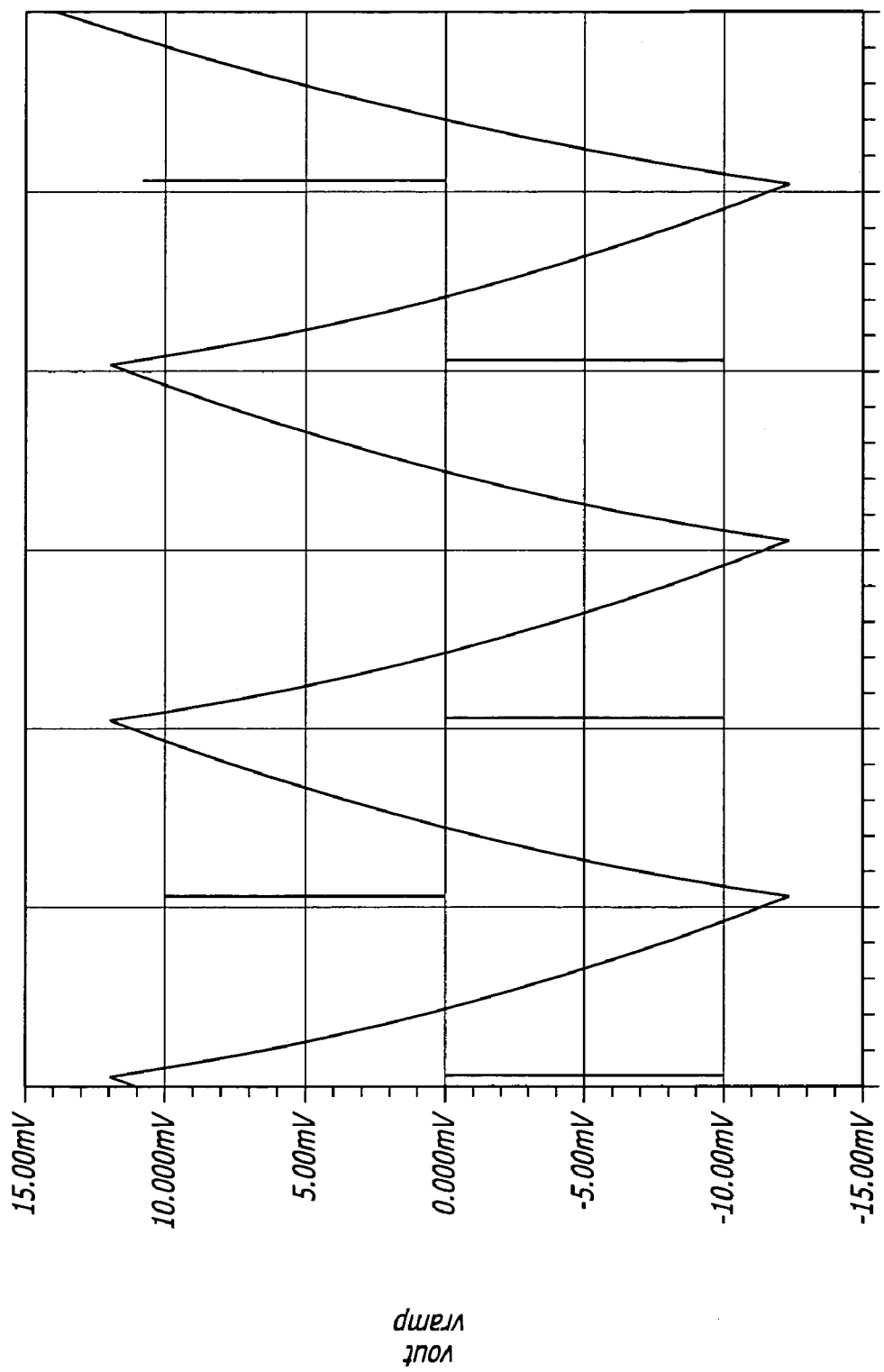
FIG. 15 illustrate the pulses on node VLX and the output VOUT across the load when the embodiment of FIG. 13 is operating with a zero input signal.
Figure 16A:
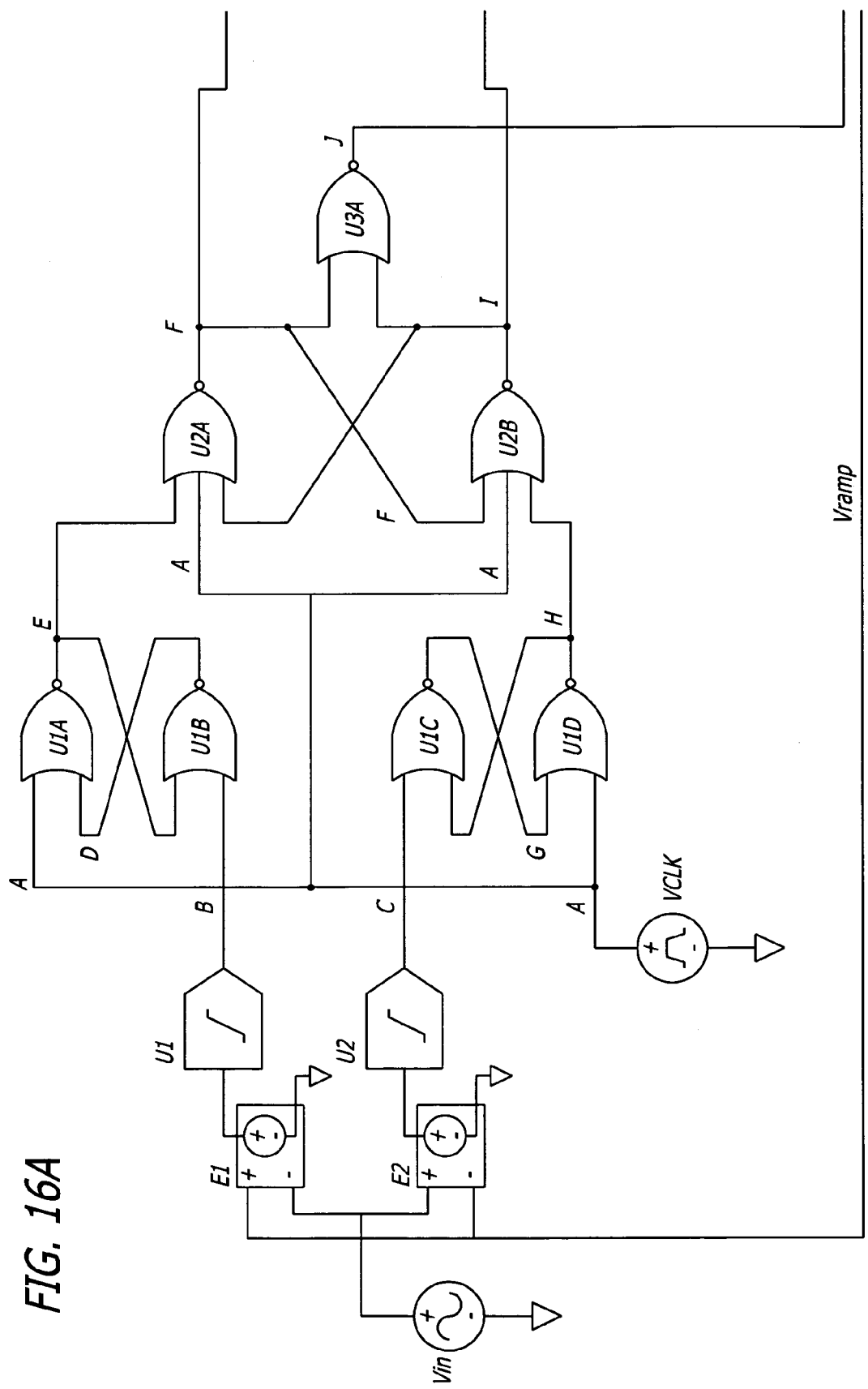
FIG. 16 is a diagram of a simulation macromodel of another embodiment of the Class D amplifier of the present invention.
Figure 16B:
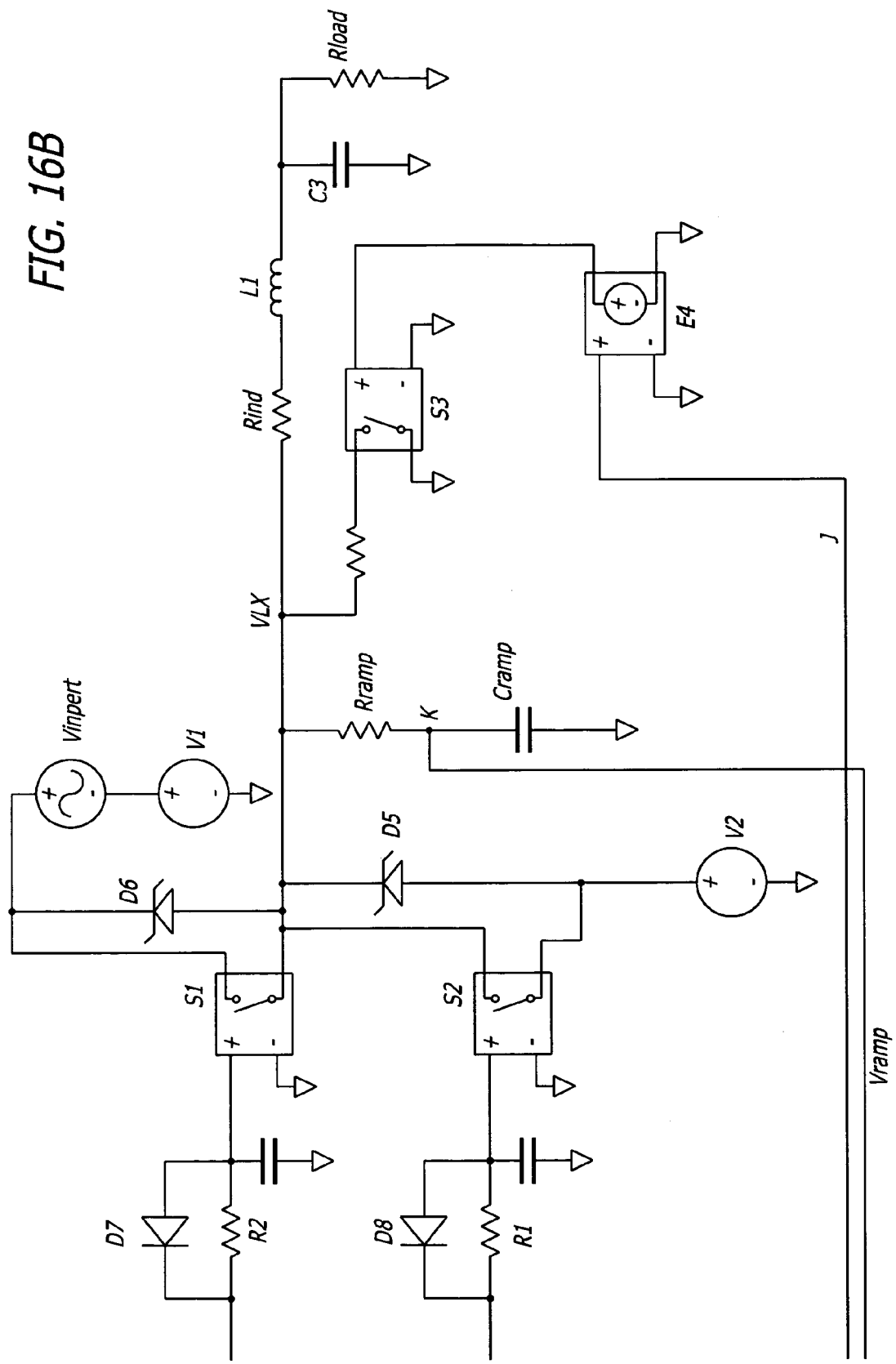

Another exemplary embodiment of the present invention may be seen in FIG. 15. In this embodiment, switch S4 has been eliminated, so that resistor Rramp and capacitor Cramp act as a continuous integrator. Now the switches S1 and S2 (and as a result, S3), are not controlled responsive to the amplitude and polarity of the input signal alone, but rather by the difference between the input signal and the accumulated voltage on the capacitor Cramp.

FIGS. 5, 6 and 13 illustrate voltages across an 8 ohm load, sometimes referred to herein as the amplifier output. This tends to associate the optional filter with, or as part of, the amplifier, not the load. Actually, while the LC filter would usually be realized with discrete components, the amplifier (or rest of the amplifier) would usually be realized as an integrated circuit. This tends to associate the filter as part of the load, not part of the amplifier. In the claims to follow, unless the context indicates otherwise, the filter, if used, is implied to be part of the load. Thus the amplifier output node generally refers to the node VLX or its equivalent, not the voltage across the speaker or other load, unless in a filterless embodiment, in which case the voltage of node VLX and the voltage across the load will generally be the same. Obviously alternatively, the amplifier could be realized in discrete form, or possibly the filter could be integrated, as desired and as appropriate for the application.

Also the present invention uses a positive power supply connection, a negative power supply connection and an intermediate voltage connection. Generally speaking, these are relative voltages. The intermediate connection is preferably a power supply ground, though by way of example, the negative power supply connection could be a power supply ground, the positive power supply connection could be the positive terminal of the power supply, and the intermediate voltage a voltage equal to approximately one half the power supply voltage. This is not preferred, however, as it does not realized the full efficiency potential of the invention unless perhaps these voltages are necessarily generated for other purposes.

Having disclosed various aspects of the present invention, various features thereof will become apparent, including:

1. Dual supply operation
2. Speaker GND return
3. More efficient compared to H-bridge topologies
4. More efficient utilization of silicon when compared to H-bridge for same output power
5. Easy Modulating ramp generation which also automatically rejects input supply variations
6. Automatic correction for drain to source drops across forward conducting FETs
7. Constant small signal control loop dynamics
8. Easy to apply negative feedback for better performance
9. Half as many filter elements required when compared to H-bridge
10. Minimum On time for minimum input signal enables Filterless operation
11. No common mode noise elements present on speaker wires
12. Easy to filter EMI components While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features as desired.

TABLE 2

Comparison of basic Class D amplifier topologies.

| | Conventional Modulation H-Bridge | Modified Modulation H-Bridge | Conventional Modulation Half Bridge | NEW HALF BRIDGE |
|---|---|---|---|---|
| Number of active switches | 4 | 4 | 2 (good) | 3 (maybe 4) |
| Number of switches in current path to load | 2 | 2 | 1 (good) | 1 (good) |

TABLE 2-continued

Comparison of basic Class D amplifier topologies.

|  | Conventional Modulation H-Bridge | Modified Modulation H-Bridge | Conventional Modulation Half Bridge | NEW HALF BRIDGE |
|---|---|---|---|---|
| Total Switch Area per same conduction power loss | X4 | X4 | X1 (good) | X2 |
| Automatic Supply Rejection (Slope$_{ramp}$ ∝ 1/V$_{supply}$) | Yes (good) | No (means not straight forward) | No (means not straight forward) | Yes (good) |
| Small signal loop dynamics with respect to supply | Constant (good) | Variable | Variable | Constant (good) |
| Supply rejection | Automatic (good) | No (means not straight forward) | No (means not straight forward) | Automatic (good) |
| Minimum pulse width with minimum input signal | No | Yes (good) | No | Yes (good) |
| "Filterless" Mode | No | Yes (good) | No | Yes (good) |
| Undesirable Common mode noise generation | Yes | Yes | No (good) | No (good) |
| Number of supply rails | 1 (good) | 1 (good) | 2 | 2 |
| Number of filter elements | 4 | 4 | 2 (good) | 2 (good) |
| Easy negative feedback application | More Complex | More Complex | Easy (good) | Easy (good) |
| Circuit Complexity | Low (good) | Low (good) | Moderate (Due to driving multiple pockets) | High (Due to driving multiple pockets) |

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features as desired.

What is claimed is:

1. In a class D amplifier having first, second and third power supply terminals for coupling to first, second and third power supply voltages, respectively, the third power supply voltage being between the first and second power supply voltages, and having an output terminal for coupling to a first terminal of a load having a second terminal of the load coupled to the third power supply terminal, the improvement comprising:
   a first switch coupled between the first power supply terminal and the output terminal;
   a second switch coupled between the second power supply terminal and the output terminal; and,
   a third switch coupled between the output terminal and the third power supply terminal, the third switch being a bilateral switch.

2. The improvement of claim 1 further comprised of control circuitry controlling the first, second and third switches responsive to an input signal.

3. The improvement of claim 2 wherein the control circuitry controls the first, second and third switches so that one and only one of the switches is on at any time.

4. The improvement of claim 3 wherein the control circuitry controls the first, second and third switches to periodically connect the output terminal to the first power supply terminal for a time period responsive to an input voltage of a first polarity, to periodically connect the output terminal to the second power supply terminal for a time period responsive to an input voltage of a second polarity, and to connect the output terminal to the third power supply terminal when the output terminal is not connected to either the first or the second power supply terminal.

5. The improvement of claim 4 wherein the control circuitry is also responsive to the voltage on the output terminal.

6. The improvement of claim 4 further including a load.

7. The improvement of claim 6 wherein the load is a filterless load.

8. The improvement of claim 7 wherein the load is a speaker.

9. The improvement of claim 6 wherein the load includes a series connected inductor having a first terminal connected to the output terminal.

10. The improvement of claim 9 further comprised of a capacitor coupled between a second terminal of the inductor and the third power supply terminal.

11. The improvement of claim 4 wherein the control circuitry determines the time periods by charging a capacitance through a resistance coupled to the output terminal.

12. The improvement of claim 4 wherein the control circuitry determines the time periods by charging a capacitance through a resistance coupled to the output terminal, from the voltage of the third power supply terminal to a voltage of an input signal.

13. The improvement of claim 4 wherein the control circuitry determines the time periods by charging a capacitance to a voltage of an input signal through a resistance coupled to the output terminal.

14. The improvement of claim 4 wherein the control circuitry determines the time periods by charging a capacitance from the voltage of the third power supply terminal to a voltage of an input signal using a first current source providing a current proportional to the voltage difference between the first and third power supply terminals when the first power supply terminal is connected to the output terminal, and using a second current source providing a current proportional to the voltage difference between the second and third power supply terminals when the second power supply terminal is connected to the output terminal.

15. The improvement of claim 4 wherein the control circuitry integrates the voltage on the output terminal and provides as an input signal, a signal responsive to the difference in the integral of the voltage on the output terminal and another input signal.

16. The improvement of claim 1 wherein the improvement is realized in an integrated circuit.

17. A method of class D amplification comprising:
   a) connecting a second terminal of a load to a third power supply terminal having a voltage between voltages on first and second power supply terminals;
   b) connecting a first terminal of the load to the first power supply terminal for a time period responsive to an input voltage of a first polarity;
   c) connecting the first terminal of the load to the second power supply terminal for a time period responsive to an input voltage of a second polarity;
   d) connecting the first and second terminals of the load together when the first terminal of the load is not connected to either the first or the second power supply terminal; and,
   e) repeating b) and c) at a clock rate having a clock period at least as long as a maximum of the time periods.

18. The method of claim 17 wherein the first power supply terminal is a positive power supply terminal, the second power supply terminal is a negative power supply terminal and the third terminal is a power supply ground terminal.

19. The method of claim 17 wherein the load is a filterless load.

20. The method of claim 19 wherein the load is a speaker.

21. The method of claim 17 wherein the load includes a series connected inductor having a first terminal connected to the load.

22. The method of claim 21 further comprised of coupling a capacitor between a second terminal of the inductor and the third power supply terminal.

23. The method of claim 17 further comprising determining the time periods by charging a capacitance through a resistance coupled to the load.

24. The method of claim 17 further comprising determining the time periods by charging a capacitance through a resistance coupled to the load, from the voltage of the third power supply terminal to a voltage of the first input signal.

25. The method of claim 17 further comprising determining the time periods by charging a capacitance to the voltage of the first input signal through a resistance coupled to the load.

26. The method of claim 17 further comprising determining the time periods by charging a capacitance from the voltage of the third power supply terminal to a voltage of the first input signal using a first current source providing a current proportional to the voltage difference between the first and third power supply terminals when the first power supply terminal is connected to the load, and using a second current source providing a current proportional to the voltage difference between the second and third power supply terminals when the second power supply terminal is connected to the load.

27. The method of claim 17 further comprising integrating the voltage on the load and providing as the first input signal, a signal responsive to the difference in the integral of the voltage on the load and a second input signal.

28. The method of claim 17 wherein the method is practiced in an integrated circuit.

29. A method of class D amplification comprising:
   a) providing first, second and third power supply terminals, the third power supply terminal having a voltage between voltages of the first and second power supply terminals;
   b) when a first input signal is received that is positive with respect to the third terminal, coupling a load between the first power supply terminal and the third power supply terminal for a time period responsive to the amplitude of the input signal;
   c) when a first input signal is received that is negative with respect to the third power supply terminal, coupling the load between the second power supply terminal and the third power supply terminal for a time period responsive to the amplitude of the input signal;
   d) when the load is not coupled to either the first power supply terminal or the second power supply terminal, coupling both terminals of the load together; and,
   e) repeating b) and c) at a clock rate having a clock period longer than a maximum of the time periods.

30. The method of claim 29 wherein the first power supply terminal is a positive power supply terminal, the second power supply terminal is a negative power supply terminal and the third terminal is a power supply ground terminal.

31. The method of claim 29 wherein the load is a filterless load.

32. The method of claim 31 wherein the load is a speaker.

33. The method of claim 29 wherein the load includes a series connected inductor and a second load.

34. The method of claim 33 further comprised of coupling a capacitor between the third terminal and a junction between the inductor and the second load.

35. The method of claim 29 further comprising determining the time periods by charging a capacitance through a resistance coupled to the load.

36. The method of claim 29 further comprising determining the time periods by charging a capacitance through a resistance coupled to the load, from the voltage of the third terminal to a voltage of the first input signal.

37. The method of claim 29 further comprising determining the time periods by charging a capacitance to the voltage of the first input signal through a resistance coupled to the load.

38. The method of claim 29 further comprising determining the time periods by charging a capacitance from the voltage of the third terminal to a voltage of the first input signal using a first current source providing a current proportional to the voltage difference between the first and third power supply terminals when the first power supply terminal is connected to the load, and using a second current source providing a current proportional to the voltage difference between the second and third power supply terminals when the second power supply terminal is connected to the load.

39. The method of claim 29 further comprising integrating the voltage on the load and providing as the first input signal, a signal responsive to the difference in the integral of the voltage on the load and a second input signal.

40. The method of claim 29 wherein the method is practiced in an integrated circuit.

41. A class D amplifier comprising:
   comparators coupled to compare a voltage on a capacitor to a first input voltage;
   logic circuitry coupled to outputs of the comparators, the logic circuitry providing first, second and third signals, the first, second and third signals coupled to first, second and third switches, respectively, the first switch when closed coupling an amplifier output node to a positive power supply terminal, the second switch when closed coupling the amplifier output node to a negative power supply terminal, and the third switch when closed, coupling the amplifier output node to a circuit ground;

a current source coupled to a capacitor to charge the capacitor toward the voltage on the amplifier output node, the current source providing a current proportional to a voltage on the first power supply terminal when the first switch is closed, and providing a current proportional to a voltage on the second power supply terminal when the second switch is closed;

the comparators and logic circuitry being configured to periodically turn on the first switch when the input voltage is positive relative to the voltage on the capacitor, to turn on the second switch when the input voltage is negative relative to the voltage on the capacitor, and to otherwise turn on the third switch.

42. The amplifier of claim 41 wherein the current source is a resistor coupled to the amplifier output node.

43. The amplifier of claim 41 wherein the current source is an active current source.

44. The amplifier of claim 43 wherein the current source provides a current responsive to the voltage on the amplifier output node.

45. The amplifier of claim 44 wherein the current source is coupled to the amplifier output node and provides a current of a polarity corresponding to the polarity of the voltage on the amplifier output node.

46. The amplifier of claim 41 further comprised of a fourth switch, the fourth switch being coupled to turn on to discharge the capacitor when the third switch is turned on.

47. The amplifier of claim 41 further comprised of an integrator coupled to the amplifier output node, a comparator having a first comparator input signal coupled to an output of the integrator, a second comparator input signal coupled to a second input signal, and an output coupled to provide the first input voltage.

48. The amplifier of claim 41 wherein the amplifier is realized as an integrated circuit.

49. A class D amplifier and speaker system comprising:
a speaker coupled to an amplifier output node;
comparators coupled to compare a voltage on a capacitor to a first input voltage;
logic circuitry coupled to outputs of the comparators, the logic circuitry providing first, second and third signals, the first, second and third signals coupled to first, second and third switches, respectively, the first switch when closed coupling the amplifier output node to a positive power supply terminal, the second switch when closed coupling the amplifier output node to a negative power supply terminal, and the third switch when closed, coupling the amplifier output node to a circuit ground;

a current source coupled to a capacitor to charge the capacitor toward the voltage on the amplifier output node, the current source providing a current proportional to a voltage on the first power supply terminal when the first switch is closed, and providing a current proportional to a voltage on the second power supply terminal when the second switch is closed;

the comparators and logic circuitry being configured to turn on the first switch when the input voltage is positive and is greater than the voltage on the capacitor, to turn on the second switch when the input voltage is negative and is negative relative to the voltage on the capacitor, and to otherwise turn on the third switch.

50. The amplifier of claim 49 wherein the current source is a resistor coupled to the amplifier output node.

51. The amplifier of claim 49 wherein the current source is an active current source.

52. The amplifier of claim 51 wherein the current source provides a current responsive to the voltage on the amplifier output node.

53. The amplifier of claim 52 wherein the current source is coupled to the amplifier output node and provides a current of a polarity corresponding to the polarity of the voltage on the amplifier output node.

54. The amplifier of claim 49 further comprised of a fourth switch, the fourth switch being coupled to turn on to discharge the capacitor when the third switch is turned on.

55. The amplifier of claim 49 further comprised of an integrator coupled to the amplifier output node, a comparator having a first comparator input signal coupled to an output of the integrator, a second comparator input signal coupled to a second input signal, and an output coupled to provide the first input voltage.

56. The amplifier and speaker system of claim 49 wherein the speaker is coupled to the amplifier output node through an LC filter.

57. The amplifier and speaker system of claim 49 wherein the speaker is connected directly to the amplifier output node.

58. The amplifier and speaker system of claim 49 wherein the amplifier is realized as an integrated circuit.

* * * * *